US012501643B2

(12) United States Patent
Escoffier et al.

(10) Patent No.: US 12,501,643 B2
(45) Date of Patent: Dec. 16, 2025

(54) ELECTRONIC DEVICE COMPRISING TRANSISTORS

(71) Applicant: Commissariat à l'Énergie Atomique et aux Énergies Alternatives, Paris (FR)

(72) Inventors: René Escoffier, Grenoble (FR); Blend Mohamad, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 672 days.

(21) Appl. No.: 17/826,706

(22) Filed: May 27, 2022

(65) Prior Publication Data

US 2022/0393026 A1 Dec. 8, 2022

(30) Foreign Application Priority Data

Jun. 4, 2021 (FR) ....................................... 2105886

(51) Int. Cl.

| | |
|---|---|
| ***H10D 30/47*** | (2025.01) |
| ***H10D 30/01*** | (2025.01) |
| ***H10D 62/85*** | (2025.01) |
| ***H10D 64/00*** | (2025.01) |
| ***H10D 84/00*** | (2025.01) |

(52) U.S. Cl.

CPC ......... *H10D 30/475* (2025.01); *H10D 30/015* (2025.01); *H10D 62/8503* (2025.01); *H10D 64/118* (2025.01); *H10D 84/151* (2025.01)

(58) Field of Classification Search

CPC .. H10D 30/015; H10D 30/474; H10D 30/475; H10D 30/476; H10D 62/8325; H10D 62/8503; H10D 62/852

See application file for complete search history.

(56) References Cited

U.S. PATENT DOCUMENTS

| | | | | |
|---|---|---|---|---|
| 2015/0295573 A1* | 10/2015 | Suzuki | H10D 62/8503 327/434 |
| 2016/0181240 A1* | 6/2016 | Mauder | H10D 30/475 257/77 |
| 2018/0068997 A1* | 3/2018 | Jeon | H10D 84/84 |
| 2020/0243518 A1* | 7/2020 | Patti | H10D 30/015 |

FOREIGN PATENT DOCUMENTS

WO WO 2017/213644 A1 12/2017

OTHER PUBLICATIONS

Preliminary Search Report for French Application No. 2105886, dated Jan. 31, 2022.

* cited by examiner

*Primary Examiner* — Jesse Y Miyoshi
(74) *Attorney, Agent, or Firm* — Wolf, Greenfield & Sacks, P.C.

(57) ABSTRACT

An electronic device including semiconductor region located on a gallium nitride layer, two electrodes, located on either side of and insulated from the semiconductor region, the electrodes partially penetrating into the gallium nitride layer, and two lateral MOS transistors formed inside and on top of the semiconductor region.

16 Claims, 5 Drawing Sheets

ELECTRONIC DEVICE COMPRISING TRANSISTORS

The present patent application claims the priority benefit of French patent application 21/05886, filed Jun. 4, 2021. The contents of this application are incorporated herein by reference in its entirety.

TECHNICAL BACKGROUND

The present disclosure generally concerns electronic devices. The present disclosure more particularly concerns normally-off high electron mobility transistors (HEMT), or HEMT transistors, and particularly normally-off HEMT transistors based on gallium nitride (GaN) and methods of manufacturing such transistors.

PRIOR ART

Gallium nitride normally-off HEMT transistors are currently used for example in electric energy conversion applications, for powers typically in the range from a few milliwatts to several tens of watts. There exist different types of normally-off HEMT transistors, particularly HEMT transistors with an insulated gate of metal-insulator-semiconductor (MIS) type, or MIS-HEMT transistors. Such transistors generally have a low threshold voltage and a high on-state resistance, which adversely affects their performance.

SUMMARY OF THE INVENTION

There is a need to improve existing gallium nitride normally-off high electron mobility transistors.

An embodiment overcomes all or part of the disadvantages of existing gallium nitride normally-off high electron mobility transistors.

An embodiment provides an electronic device comprising:

- a semiconductor region located on a gallium nitride layer;
- two electrodes, located on either side of and insulated from the semiconductor region, the electrodes partially penetrating into the gallium nitride layer; and
- two lateral MOS transistors formed inside and on top of the semiconductor region.

According to an embodiment, each transistor is configured to control the flowing of an electric current between one of said electrodes and one or a plurality of second electrodes supported by the semiconductor region.

According to an embodiment, each transistor comprises a gate region located vertically in line with a channel region located between source and drain regions formed in the semiconductor region.

According to an embodiment, the source regions of the transistors are doped with a first conductivity type and separated by a well formed in the semiconductor region and doped with a second conductivity type, opposite to the first conductivity type.

According to an embodiment, the drain region of each transistor is coupled, via a two-dimensional electron gas, to one of said electrodes.

According to an embodiment, the device further comprises one or a plurality of conductive regions contacting the drain regions of the transistors and partially penetrating into the gallium nitride layer.

According to an embodiment, the device comprises exactly two conductive regions coating opposite sides of the semiconductor region located in front of said electrodes and a single second electrode located between the transistors.

According to an embodiment, the device comprises exactly two conductive regions comprising conductive vias located on either side of the semiconductor region and a single second electrode located between the transistors.

According to an embodiment, the device comprises a single conductive region comprising a conductive via crossing the semiconductor region and exactly two second electrodes located on either side of the transistors.

According to an embodiment, the semiconductor region partially penetrates into the gallium nitride layer.

According to an embodiment, a lower portion of the semiconductor region is insulated from the gallium nitride layer.

According to an embodiment, the first electrodes are intended to be taken to a same potential.

According to an embodiment, the semiconductor region is made of a material different from that of the gallium nitride layer, preferably of silicon or of silicon carbide.

An embodiment provides a method of forming a device such as described, the method comprising the following steps:

a) forming a trench inside of the gallium nitride layer;
b) forming the first electrodes on either side of the trench;
c) filling the trench with the semiconductor region; and
d) forming the MOS transistors.

According to an embodiment, the method further comprises, after step d), the step of forming the second electrode(s).

According to an embodiment, the conductive region(s) are formed at step b).

BRIEF DESCRIPTION OF THE DRAWINGS

The foregoing and other features and advantages of the present invention will be discussed in detail in the following non-limiting description of specific embodiments and implementation modes in connection with the accompanying drawings, in which.

DESCRIPTION OF THE EMBODIMENTS

Figure 1:
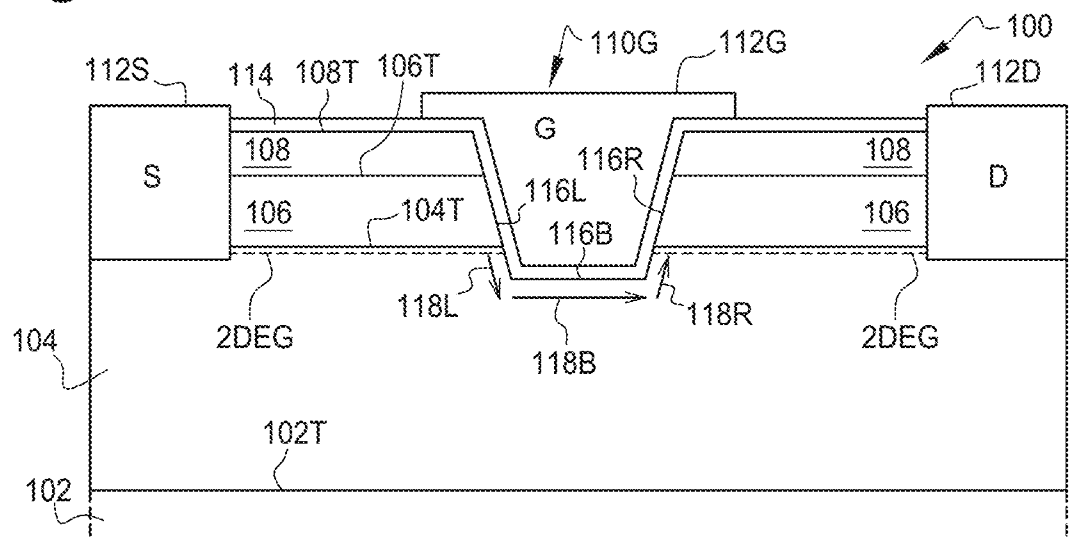
FIG. 1 is a partial simplified cross-section view of an example of a transistor.

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and will be detailed. In particular, the applications and systems likely to take advantage of the described electronic devices are not detailed, the described embodiments and implementation modes of the present disclosure being in particular compatible with usual applications and systems comprising high electron mobility gallium nitride transistors.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms “front”, “back”, “top”, “bottom”, “left”, “right”, etc., or to relative positional qualifiers, such as the terms “above”, “below”, “upper”, “lower”, etc., or to qualifiers of orientation, such as “horizontal”, “vertical”, etc., reference is made to the orientation shown in the figures.

Unless specified otherwise, the expressions “about”, “approximately”, “substantially”, and “in the order of” signify within 10%, preferably within 5%, or, when concerning angular values, within 10°, preferably within 5°.

In the following description, unless specified otherwise, the terms insulating and conducting respectively signify electrically insulating and electrically conducting.

FIG. 1 is a partial simplified cross-section view of an example of a high electron mobility transistor (HEMT) 100, or HEMT transistor. HEMT transistor 100 is normally off in this example.

In the shown example, HEMT transistor 100 is formed on a substrate 102, for example a wafer or a piece of a wafer, a single portion of which is shown in FIG. 1. As an example, substrate 102 is made of a semiconductor material, for example, silicon, sapphire, etc.

In the orientation of FIG. 1, a layer 104 coats an upper surface 102T of substrate 102. As an example, layer 104 is made of gallium nitride (GaN), for example, of intrinsic, that is, non-intentionally doped, gallium nitride.

In the shown example, another layer 106, for example, made of aluminum gallium nitride (AlGaN), coats an upper surface 104T of layer 104 and still another layer 108, for example, made of silicon nitride (SiN), coats an upper surface 106T of layer 106.

Transistor 100 comprises a gate region 110G. The gate region 110G of transistor 100 is said to be recessed in gallium nitride layer 104. More precisely, in the shown example, gate region 110G extends vertically, from an upper surface 108T of layer 108, towards the upper surface 102T of substrate 102. Each layer 106, 108 thus comprises two separate portions, located on either side of gate region 110G.

In the shown example, the gate region 110G of transistor 100 comprises a gate electrode 112G (G). Electrode 112G has a T-shaped cross-section, having a vertical portion crossing layers 108 and 106 and partially penetrating into the thickness of layer 104 and having a horizontal portion extending above layer 108.

In the shown example, the sides of the vertical portion of the T formed by gate electrode 112G are inclined so that they come closer to each other at the bottom of electrode 112G. This enables to facilitate the flowing of electrons from one side to the other of electrode 112G.

Gate electrode 112G is made of a conductive material. As an example, electrode 112G is made of a metal or of a metal alloy, for example, an alloy based on titanium nitride (TiN) and on tungsten (W).

In the shown example, still another layer 114 insulates electrode 112G from layers 104, 106, and 108. Layer 114 is made of an insulating material, for example, alumina ($Al_2O_3$).

Insulating layer 114 coats the lateral surfaces 116L, 116R, or walls, and a lower surface 116B, or bottom, of the vertical portion of the T formed by electrode 112G. Further, insulating layer 114 laterally extends on either side of the vertical portion and under the horizontal portion of the T formed by electrode 112G. Layer 114 extends on top of and in contact with the upper portion 108T of layer 108.

In the shown example, the horizontal portion of the T formed by electrode 112G extends on top of and in contact with portions of layer 114. These portions of layer 114 are thus vertically interposed between layer 108 and the horizontal portion of the T formed by electrode 112G.

The portions of layer 114 located vertically in line with gate electrode 112G may be considered as forming part of the gate region 110G of transistor 100.

In the shown example, insulating layer 114 has a substantially constant thickness. As an example, the thickness of layer 114 is equal to approximately 30 nm, to within 20%. This enables to properly insulate gate electrode 112C from gallium nitride layer 104 while keeping a relatively low threshold voltage Vth, for example, in the order of 1 V.

Transistor 100 further comprises two other electrodes 112S and 112D. Electrodes 112S and 112D are located on either side of the gate electrode 112G of transistor 100. Electrode 112S is for example closer to gate electrode 112G than electrode 112D. The electrodes 112S, 112G, and 112D of transistor 100 extend perpendicularly to the cross-section plane of FIG. 1, along a direction commonly called width (W) of transistor 100. The cross-section plane of FIG. 1 is thus oriented parallel to another direction commonly called length (L) of transistor 100 and perpendicularly to the upper surface 108T of layer 108.

As an example:

electrode 112S is separated from electrode 112G by a distance in the range from 1 to 2 μm, for example, equal to approximately 1 μm; and electrode 112D is separated from electrode 112G by a distance in the range from 10 to 20 μm, for example, equal to approximately 10 μm, to ensure a voltage resistance for example ranging up to 1,000 V (the gallium nitride of layer 104 can theoretically withstand a maximum electric field in the order of 2 MV/cm; however, this field is in practice limited to 1 MV/cm due to defects present in layer 104).

In the shown example, electrodes 112S and 112D each vertically extend, from the upper surface of insulating layer 114, towards the upper surface 102T of substrate 102. More precisely, in the shown example, electrodes 112S and 112D each cross layers 114, 108, and 106 and partially penetrate into the thickness of layer 104.

Electrodes 112S and 112D are each made of a conducting material, for example, a metal or a metal alloy. Electrodes 112S and 112D are for example made of the same material as electrode 112G.

As an example, when transistor 100 is operating, electrode 112S is a source electrode (S) and electrode 112D is a drain electrode (D). Electrode 112D being more distant from electrode 112G than electrode 112S, this enables to apply a high potential, for example in the order of 650 V, on electrode 112D with no risk of breakdown of transistor 100, electrodes 112S and 112G being generally submitted to potentials in the order of a few volts.

In HEMT transistor 100, a two-dimensional electron gas 2DEG, symbolized in FIG. 1 by a dotted line, forms inside of layer 104 close to an interface between layers 104 and 106. The electrodes 112S and 112D of HEMT transistor 100 are each in contact with two-dimensional electron gas 2DEG.

In the shown example where HEMT transistor 100 is normally off, two-dimensional electron gas 2DEG is interrupted by gate region 110G. More precisely, in this example, two-dimensional electron gas 2DEG is discontinuous and comprises two portions located on either side of the gate region 110G of transistor 100 (on the left-hand side and on the right-hand side of region 110G, in the orientation of FIG. 1).

When a voltage Vgs smaller than the threshold voltage Vth of transistor 100, for example substantially zero, is applied between gate electrode 112G and source electrode 112S, the gate region 110G recessed in gallium nitride layer 104 prevents electrons from flowing between source electrode 112S and drain electrode 112D. Transistor 100 then is in an off state.

However, when the voltage Vgs applied between gate electrode 112G and source electrode 112S exceeds the threshold voltage Vth of transistor 100, electrons may flow between source electrode 112S and drain electrode 112D. Transistor 100 then is in a conducting state.

In the conducting state, electrons flow from one portion to the other of two-dimensional electron gas 2DEG around gate region 110G. More precisely, when transistor 100 is conducting and submitted to a bias voltage applied between its drain D and its source S, the electrons then follow, to flow from one side to the other of gate G, a conduction path located inside of layer 104 along an interface between layer 104 and insulating layer 114.

The conduction path followed by the electrons to bypass gate region 110G is symbolized, in FIG. 1, by arrows 118L, 118B, and 118R. More particularly, in the orientation of FIG. 1:

arrow 118L symbolizes a path followed by the electrons to flow down along the side 116L of gate electrode 112G located on the side of source electrode 112S;

arrow 118B symbolizes a path followed by the electrons to displace horizontally under the bottom 116B of gate electrode 112G; and arrow 118R symbolizes a path followed by the electrons to flow up along the other side 116R of gate electrode 112G opposite to side 116L, located on the side of drain electrode 112D.

Although this has not been shown in FIG. 1, transistor 100 may further comprise other elements such as insulating layers coating layer 114 and/or a portion of gate electrode 112G, field plates, contacting elements, etc.

A disadvantage of HEMT transistors similar to transistor 100 lies in the fact that they have, in the conducting state, a high on-state drain-source resistance Ron which strongly degrades their electric performance. This is particularly due to resistances associated with the conduction paths 118L, 118B, and 118R followed by the electrons to bypass gate region 110G, which cause a loss of electron mobility.

Another disadvantage of these transistors originates from defects present inside of gallium nitride layer 104 and which induce, on conduction paths 118L, 118B, and 118R, an electron trapping. This causes, in unwanted fashion, a hysteresis phenomenon observable by measuring variations of drain current Id according to gate-source voltage Vgs (curves Id(Vgs)) as well as a phenomenon of attenuation of drain current Id after the biasing of the transistor, also called current collapse phenomenon.

To decrease the on-state resistance Ron of transistor 100, it may be devised to provide a structure where insulating layer 114 would be omitted and where gate electrode 112G would not penetrate into gallium nitride layer 104. This would for example amount to ascertaining that electrode 112G stops in the thickness of layer 106, before the interface between layer 106 and layer 104. A Schottky-type gate, which would enable to locally interrupt or attenuate the two-dimensional electron gas 2DEG vertically in line with gate electrode 112G to obtain a normally-off transistor, would then be formed. However, this would not enable to reach a threshold voltage Vth greater than approximately 1 V, which is a problem for most applications using HEMT transistors.

It may further be devised to form a structure where gate region 110G would not be recessed in layers 108, 106, and 104. This would for example amount to forming gate electrode 112G on top of and in contact with layer 108. As an example, an implantation of fluorine ions (Ft) may in particular be provided in layer 106, vertically in line with gate electrode 112G, which would result in attenuating or in interrupting the two-dimensional electrons gas 2DEG under the gate of transistor 100. This would however tend to complicate a control of threshold voltage Vth.

It could as an alternative be provided to omit layer 114, to form gate electrode 112G above layer 108, and to interpose a P-type doped gallium nitride layer (p-GaN) between the gate electrode and layer 108. However, this would not enable to reach a threshold voltage Vth sufficiently high for the targeted applications.

It could further be imagined to decrease the width of the lower surface 116B of the vertical portion of the T formed by gate region 110G, to decrease the length of horizontal conduction path 118B. However, this would not enable to significantly decrease the on-state resistance Ron of transistor 100.

Figure 2:
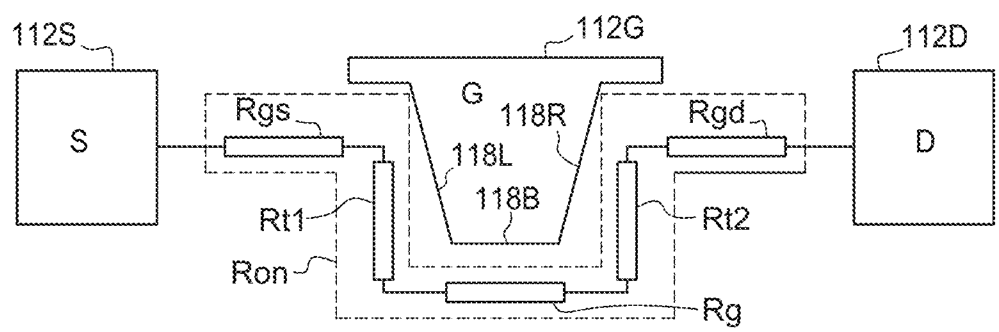
FIG. 2 is an electric diagram equivalent to the transistor of FIG. 1.

FIG. 2 is an electric diagram equivalent to the transistor 100 of FIG. 1.

As illustrated in FIG. 2, the on-state resistance Ron of transistor 100, between its source terminal 112S and its drain terminal 112D, may be broken down into:

a resistance Rgs, corresponding to a conduction path following the portion of two-dimensional electron gas 2DEG located between source electrode 112S and gate electrode 112G;

another resistance Rt1, corresponding to the conduction path 118L followed by the electrons to flow down along side 116L of electrode 112G;

still another resistance Rg, corresponding to the conduction path 118B followed by the electrons to horizontally displace under the bottom 116B of electrode 112G;

still another resistance Rt2, corresponding to the conduction path 118R followed by the electrons to flow up along side 116R of electrode 112G; and still another resistance Rgd, corresponding to a conduction path following the portion of the two-dimensional electron gas 2DEG located between gate electrode 112G and drain electrode 112D.

Resistors Rgs, Rt1, Rg, Rt2, and Rgd, the series association of which is equivalent to resistor Ron, neglecting the source and drain ohmic contact resistances, adversely affect the operation of transistor 100 as has been previously discussed in relation with FIG. 1. In particular, resistors Rt1 and Rt2 generally have a significant value, which modifies the on-state resistance Ron of transistor 100.

Figure 3:
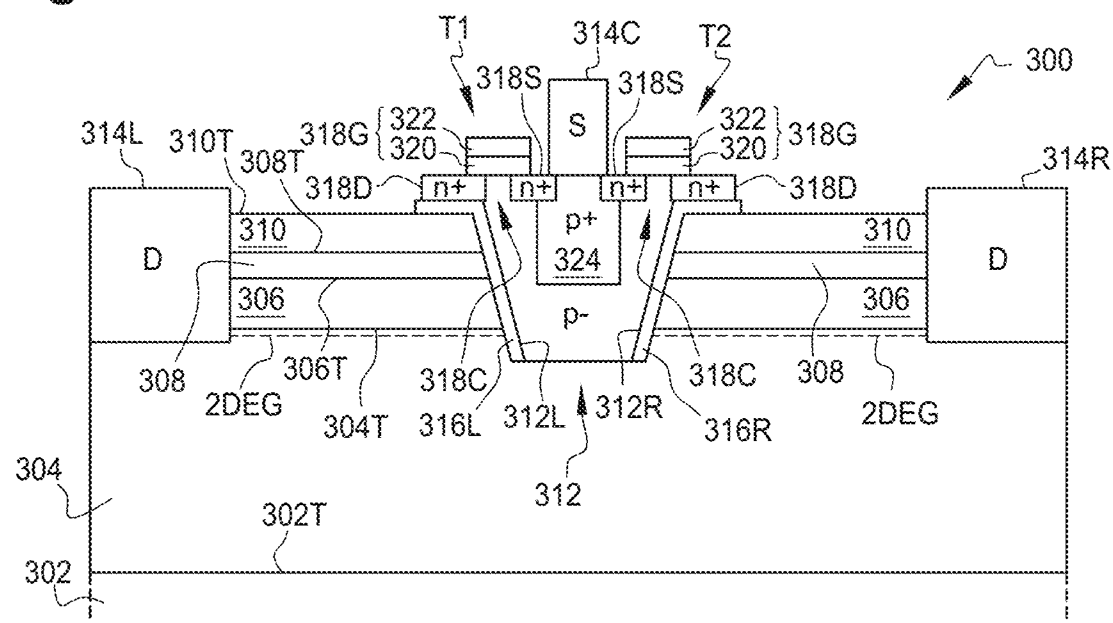
FIG. 3 is a partial simplified cross-section view of an electronic device according to a first embodiment.

FIG. 3 is a partial simplified cross-section view of an electronic device 300 according to a first embodiment.

Device 300 is for example formed on a substrate 302 similar to the substrate 102 previously described in relation with FIG. 1.

In the orientation of FIG. 3, a layer 304 coats an upper surface 302T of substrate 302. As an example, layer 304 is made of gallium nitride (GaN), for example, intrinsic, that is, non-intentionally doped, gallium nitride.

In the shown example:

another layer 306, for example, made of aluminum gallium nitride (AlGaN), coats an upper surface 304T of layer 304;

still another layer 308, for example, a silicon nitride (SiN) passivation layer, coats an upper surface 306T of layer 306; and still another layer 310, for example, made of alumina ($Al_2O_3$), coats an upper surface 308T of layer 308.

According to an embodiment, device 300 comprises a semiconductor region 312, located on a gallium nitride layer 304, and two electrodes 314L (D) and 314R (D) located on either side of semiconductor region 312. In the shown example, semiconductor region 312 and electrodes 314L and 314R partially penetrate into gallium nitride layer 304. Electrodes 314L and 314R are insulated from region 312, in other words, electrodes 314L and 314R are not in contact with region 312. Each electrode 314L, 314R is for example separated from region 312 by a distance in the range from 10 to 20 μm, for example, equal to approximately 10 μm, to ensure a voltage resistance, for example, up to 1,000 V.

Semiconductor region 312 is made of a material different from that of layer 304. Region 312 is preferably made of silicon (Si) or of silicon carbide (SiC).

In device 300, a two-dimensional electron gas 2DEG, symbolized in FIG. 3 by a dotted line, is present in layer 304 close to an interface between layers 304 and 306. The electrodes 314L and 314R of device 300 are both in contact with two-dimensional electron gas 2DEG. In the shown example, two-dimensional electron gas 2DEG is interrupted by region 312 and thus comprises two portions located on either side of the gate region 312 (on the left-hand side and on the right-hand side of region 312, in the orientation of FIG. 3).

In the shown example, the sides 312L and 312R of semiconductor region 312, located respectively in front of electrodes 314L and 314R, are coated with conductive regions 316L and 316R. Conductive regions 316L and 316R for example extend all along the height of the sides 312L and 312R of semiconductor region 312 and extend on top of and in contact with an upper surface 310T of layer 310. In particular, in this example, conductive regions 316L and 316R penetrate into gallium nitride layer 304 and each contact a portion of two-dimensional electrode gas 2DEG. Each portion of two-dimensional electron gas 2DEG thus extends laterally between one of conductive regions 316L, 316R and the electrode 314L, 314R facing it.

According to an embodiment, device 300 further comprises two metal-oxide-semiconductor field-effect transistors (MOSFET) T1 and T2, also called MOSFET transistors or, more simply, MOS transistors. Transistors T1 and T2 are more precisely lateral transistors formed inside and on top of semiconductor region 312. In the shown example, each MOS transistor T1, T2 comprises a gate region 318G located vertically in line with a channel region 318C located between a source region 318S and a drain region 318D. Regions 318S and 318D are formed in semiconductor region 312. Region 318C is also located in semiconductor region 312. The gate region 318G of each MOS transistor T1, T2 for example comprises an insulating region 320, located on top of and in contact with an upper surface of region 312 above channel region 318C, and a conductive region 322 coating an upper surface of insulating region 320. Regions 320 and 322 for example respectively form a gate insulator, or oxide, and a gate electrode of the MOS transistor.

The drain regions 318D of transistors T1 and T2 are respectively located on top of and in contact with portions of conductive regions 316L and 316R. Thereby, conductive regions 316L and 316R enable to create an electric contact between, on the one hand, the drain regions 318D of transistors T1 and T2 and, on the other hand, the portions of the two-dimensional electron gas located on the side of the electrodes 314L and 314R of device 300. Conductive regions 316L and 316R each have a substantially zero resistance, thus advantageously enabling electrons to easily flow between the portions of two-dimensional electron gas 2DEG and the drain regions 318D of transistors T1 and T2.

In the shown example, device 300 further comprises another electrode 314C (S) located between the two MOS transistors T1 and T2. Electrode 314C is supported by semiconductor region 312. More precisely, in this example, electrode 314C is located on top of and in contact with the upper surface of region 312 vertically in line with a well 324 formed in region 312.

The source 318S and drain 318D regions of MOS transistors T1 and T2 are for example doped with a first conductivity type, for example, type n, while well 324 and the other portions of semiconductor region 312 are for example doped with a second conductivity type opposite to the first conductivity type, type p in this example. More precisely, regions 318S and 318D are for example heavily n-type doped (n+), while well 324 is heavily p-type doped (p+) and the remaining portions of region 312 are heavily p-type doped (p−). In this case, the channel regions 318C of MOS transistors T1 and T2 are heavily p-type doped. As a variant, well 324 may however be omitted, electrode 314C being then directly in contact with a lightly p-type doped portion of region 312.

The electrodes 314L and 314R of device 300 are intended to be taken to a same potential, for example, equal to approximately 650 V, while electrode 314C is taken to a reference potential, for example, the ground (0 V). Electrodes 314L and 314R may for example be likened to drain electrodes of device 300 while electrode 314C may be likened to a source electrode of device 300.

Each MOS transistor T1, T2 is configured to control the flowing of an electric current between one of electrodes 314L, 314R and electrode 314C, for example, according to a control potential applied to the gate electrode 322 of the transistor. Transistors T1 and T2 are for example controlled simultaneously by the application, on their respective gate electrodes 322, of a common potential (with respect to source electrode 314C) enabling, according to its value, to interrupt or to establish the current between electrode 314L, 314R and electrode 314C.

When transistor T1, T2 is in a conducting state, an electric current flows between electrode 314L, 314R and electrode 314C. This electric current more precisely transits:

- through the portion of two-dimensional electron gas 2DEG located between electrode 314L, 314R and the conductive region 316L, 316R facing this electrode;
- through conductive region 316L, 316R;
- through the drain 318D, channel 318C, and source 318S regions of transistor T1, T2; and
- through well 324.

An advantage of device 300 lies in the fact that it enables to decouple the voltage resistance function, implemented by the distance separating each electrode 314L, 314R from semiconductor region 312, and the switching function, implemented by lateral MOS transistors T1 and T2. This enables device 300 to have an operation similar to that of a HEMT transistor, the source electrode of which would correspond to electrode 314C, the drain electrode of which would correspond to electrodes 314L and 314R, and the control of which would be performed by biasing the gate electrodes 322 of MOS transistors T1 and T2.

Due to the fact that the switching function is implemented by MOS transistors T1 and T2, which each have a threshold voltage in the order of 5 V, device 300 advantageously has a threshold voltage greater than that of the HEMT transistor 100 of FIG. 1.

Further, the p-type doping (p+) of well 324 advantageously enables to form a good ohmic contact, and thus to obtain a low contact resistance, between electrode 314C and region 312. The power efficiency of device 300 is thus improved by decreasing its on-state resistance Ron.

Device 300 is also more compact than a device where at least one transistor similar to transistors T1 and T2 would be located outside of the region delimited by electrodes 314L and 314R, for example, on a separate chip.

Figure 4:
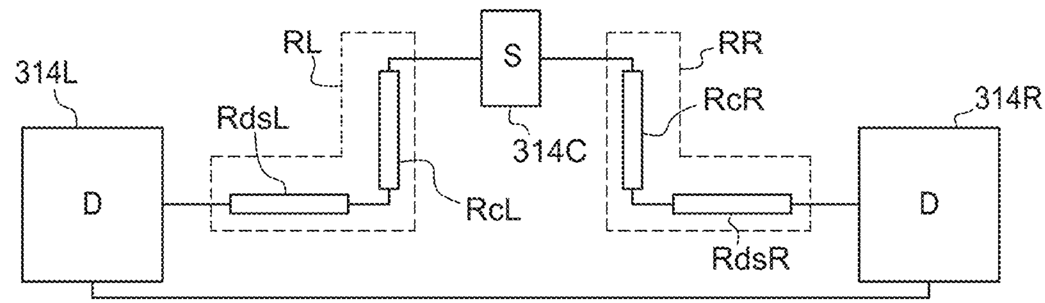
FIG. 4 is an electric diagram equivalent to the electronic device of FIG. 3.

FIG. 4 is an electric diagram equivalent to the electronic device 300 of FIG. 3.

The on-state resistance Ron of device 300, between its electrodes 314L, 314R and its electrode 314C, may be broken down into two resistors RL and RR associated in parallel. Each resistor RL, RR more precisely comprises a series association:

- of a resistor RdsL, RdsR corresponding to a conduction path following the portion of two-dimensional electron gas 2DEG located between electrode 314L, 314R and conductive region 316L, 316R; and
- of another resistor RcL, RcR corresponding to a conduction path through the channel region 318C of transistor T1, T2.

Resistance RdsL is for example substantially equal to resistance RdsR, to within manufacturing dispersions. Similarly, resistance RcL is for example substantially equal to resistance RcR, to within manufacturing dispersions.

In the diagram of FIG. 4, contact resistors as well as resistors corresponding to conduction paths through conductive regions 316L, 316R, through drain 318D and source 318S regions, and through well 324 are not shown, since these resistors may for example be considered as negligible as compared with resistors RdsL, RdsR, RcL, and RcR.

Each resistance RdsL, RdsR of device 300 is for example substantially equivalent to the resistance Rgd of transistor 100. Each resistance RcL, RcR is smaller than resistances Rt1, Rg, and Rt2. This is particularly due to the fact that the conduction paths through region 318C have a shorter length and a lower resistivity than conduction paths 118L, 118B, and 118R inside of gallium nitride layer 304. Device 300 thus advantageously has an on-state resistance Ron smaller than that of transistor 100. Further, device 300 advantageously enables to avoid the trapping and current collapse phenomena previously discussed in relation with FIG. 1.

Figure 5:
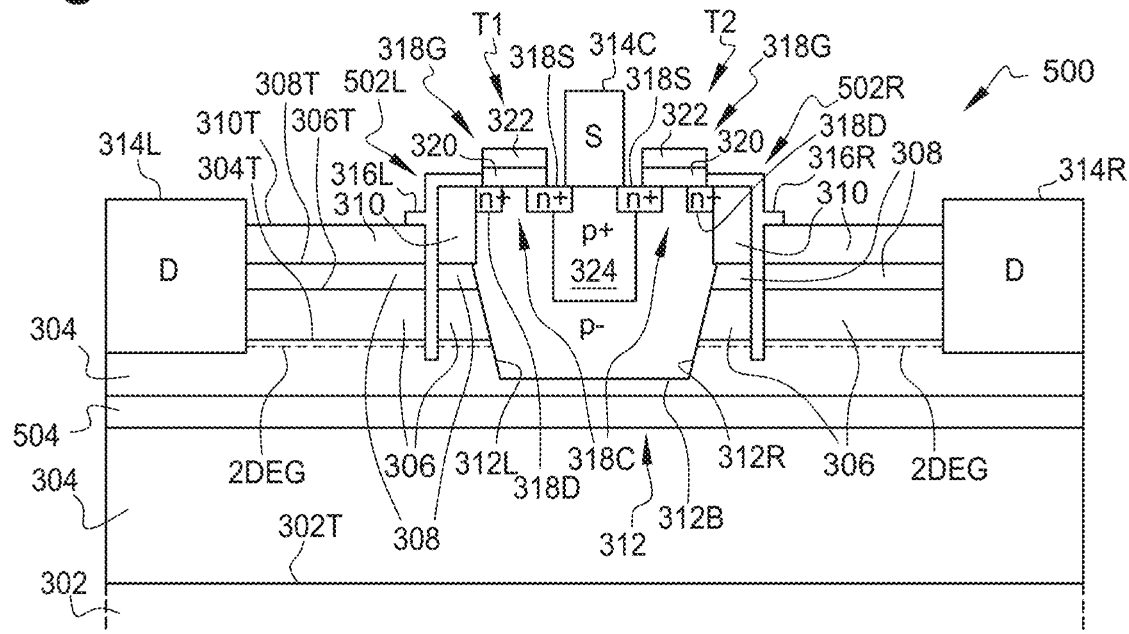
FIG. 5 is a partial simplified cross-section view of an electronic device according to a second embodiment.

FIG. 5 is a partial simplified cross-section view of an electronic device 500 according to a second embodiment. The device 500 of FIG. 3 comprises elements common with the device 300 of FIG. 3. These common elements will not be detailed again hereafter. The device 500 of FIG. 5 differs from the device 300 of FIG. 3 mainly in that the conductive regions 316L and 316R of device 500 do not coat the sides 312L and 312R of semiconductor region 312.

More precisely, in device 500, each conductive region 316L, 316R for example comprises a conductive via 502L, 502R partially penetrating into gallium nitride layer 304. Via 502L, 502R contact the portion of two-dimensional electron gas 2DEG located on the side of electrode 314L, 314R. As illustrated in FIG. 5, each conductive region 316L, 316R further comprises a portion extending on top of and in contact with the drain region 318D of transistor T1, T2.

The conductive regions 316L and 316R of device 500 advantageously enable, as previously described in relation with FIG. 3, to facilitate the flowing of electrons between the portions of two-dimensional electron gas 2DEG and the drain regions 318D of transistors T1 and T2.

In the shown example, device 500 optionally further comprises a layer 504 formed inside of gallium nitride layer 304. Layer 504 is for example a doped insulating layer of the second conductivity type, in this example, type p, and called back barrier layer. As an example, layer 504 is made of aluminum gallium nitride (AlGaN) and has an aluminum content for example in the range from 10 to 15%. Layer 504 for example has a thickness in the range from 50 to 100 nm and is located at a distance of approximately 50 nm from a lower surface 312B of region 312.

The presence of layer 504 in device 500 advantageously enables to confine electrons in a portion of layer 304 of small thickness, located between layer 504 and the upper surface 304T of layer 304. A bulk trapping of electrons inside of layer 304 is thus avoided or limited. Further, layer 504 advantageously enables to further insulate semiconductor region 312 with respect to substrate 302, thus avoiding or limiting for example the occurrence of a vertical current, originating from substrate 302, consecutive to an interruption of the current flowing between electrodes 314L, 314R, and electrode 314C when device 500 is switched from the on state to the off state.

Another advantage of this embodiment lies in the fact that conductive vias 502L and 502R may be formed independently from semiconductor region 312. This particularly allows a greater liberty in the adjustment of the dimensions of these vias. Vias 502L and 502R and electrodes 314L and 314R may further advantageously be formed during a same step, for example, at the end of the forming of device 500.

Figure 6:
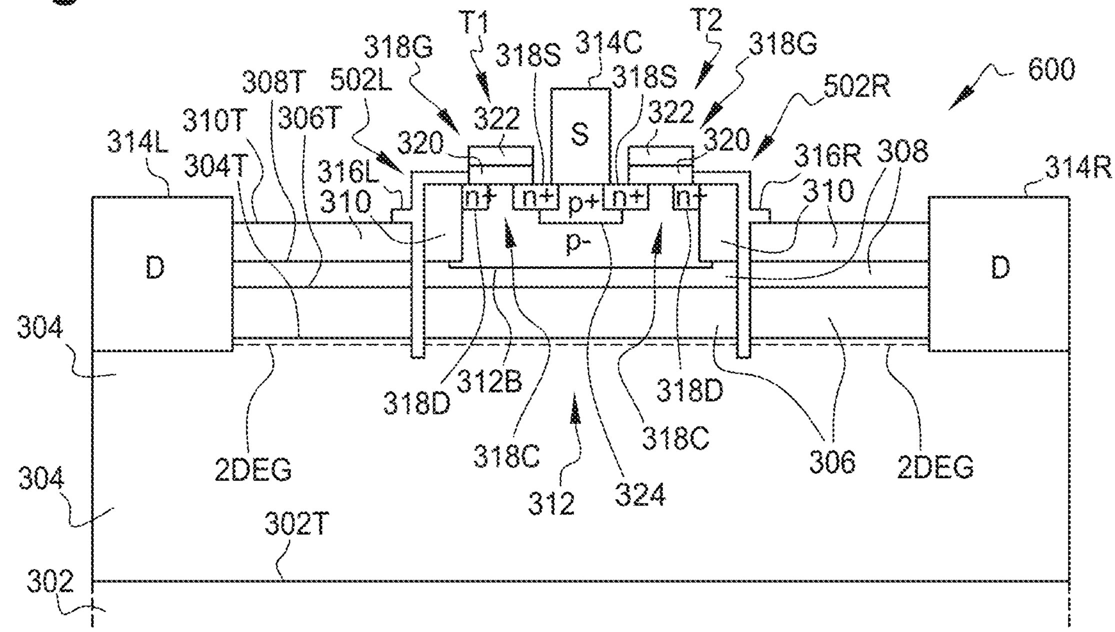
FIG. 6 is a partial simplified cross-section view of an electronic device according to a third embodiment.

FIG. 6 is a partial simplified cross-section view of an electronic device 600 according to a third embodiment. The device 600 of FIG. 6 comprises elements common with the device 500 of FIG. 5. These common elements will not be detailed again hereafter. The device 600 of FIG. 6 differs from the device 500 of FIG. 5 mainly in that semiconductor region 312 does not penetrate into gallium nitride layer 304.

More precisely, in device 600, the lower surface 312B of semiconductor region 312 is located at the level of layer 308, for example, on top of and in contact with the upper surface 308T of layer 308 or across the thickness of layer 308. The lower surface 312B of region 312 is thus insulated from gallium nitride layer 304 by all or part of layer 308 and by layer 306. In device 600, region 312 has, as compared with devices 300 and 500, a lower thickness. This advantageously enables to limit or to avoid lateral leakages in region 312 and to obtain a better electrostatic control. The thickness of region 312 is for example adapted according to an intensity of a current flowing through device 600 in the on state, that is, when transistors T1 and T2 are controlled to the on state.

As compared with device 500, device 600 is further deprived of layer 504 in the example illustrated in FIG. 6. As a variant, layer 504 may however be provided in device 600 to obtain advantages similar to those discussed in relation with FIG. 5.

As an example, semiconductor region 312 is formed by a silicon-on-insulator (SOI) wafer manufacturing method, for example, the method known under trade name "SMART CUT" of company SOITEC. In this case, a thin silicon layer is for example transferred above layer 304, for example by gluing to layer 308. This thin silicon layer is then thinned by grinding, to obtain a thickness for example in the range from 50 to 100 nm, and then etched to form the region 312 of each device 600. Semiconductor region 312 can thus advantageously be made of a crystalline material, for example of crystalline silicon or silicon carbide, inside of which the electron mobility is higher due to a low presence of defects. This enables to still further decrease the on-state resistance Ron of device 600.

Another advantage of device 600 lies in the fact that a portion of two-dimensional gas 2DEG is present under semiconductor region 312, between two conductive vias 502L and 502R. This enables to deplete, by electrostatic effect, p-type doped region 312. As a result, the threshold region of device 600 is increased, particularly with respect to device 500.

As a variant, semiconductor region 312 may in this case be undoped, except for regions 318S and 318D and possibly for well 324, due to the presence of two-dimensional electron gas 2DEG under region 312. The channel regions 318C of transistors T1 and T2 are in this case undoped.

Figure 7:
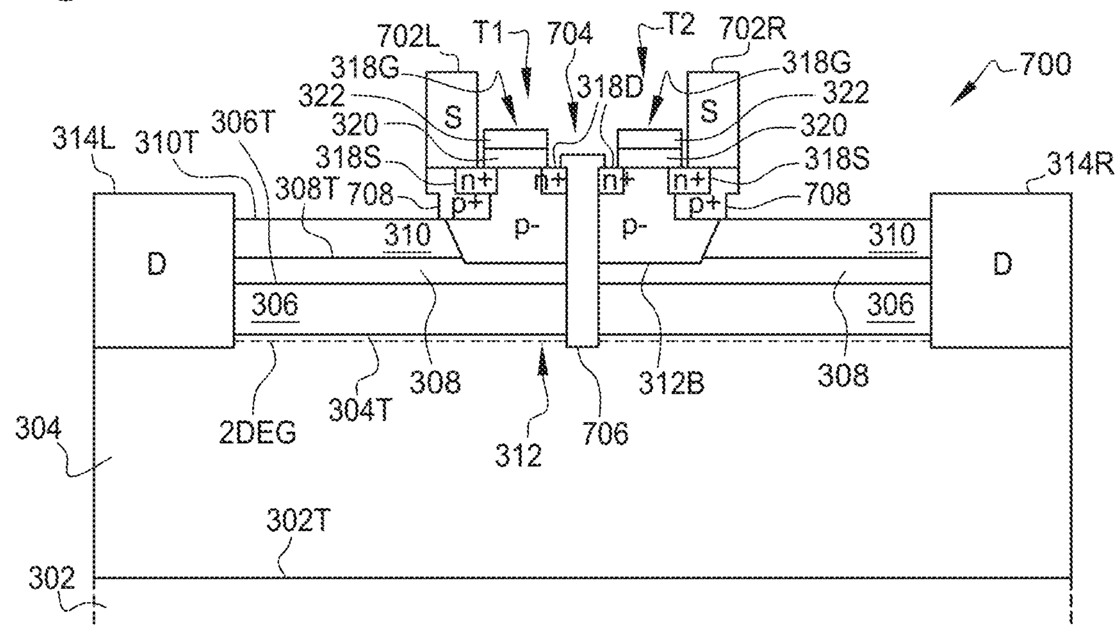
FIG. 7 is a partial simplified cross-section view of an electronic device according to a fourth embodiment.

FIG. 7 is a partial simplified cross-section view of an electronic device 700 according to a fourth embodiment. The device 700 of FIG. 7 comprises elements common with the device 600 of FIG. 6. These common elements will not be detailed again hereafter.

The device 700 of FIG. 7 differs from the device 600 of FIG. 6 mainly in that device 700 comprises two electrodes 702L (S) and 702R (S) supported by semiconductor region 312 and located on either side of transistors T1 and T2 on top of and in contact with the source regions 318S of these transistors. Further, in device 700, two-dimensional electron gas 2DEG is electrically connected to the drain regions 318D of transistors T1 and T2 by a single conductive region 704. Region 704 for example comprises a conductive via 706 integrally crossing region 312, layer 308, and layer 306 and partially penetrating into gallium nitride layer 304. To obtain low contact resistances, conductive region 704 may, as illustrated in FIG. 7, comprise a portion laterally extending on top of and in contact with the drain regions 318D of transistors T1 and T2, transistors T1 and T2 being located on either side of conductive via 706.

In the shown example, the source regions 318S of transistors T1 and T2 are separated from the upper surface 310T of layer 310 by heavily-doped regions 708 of the second conductivity type, here type p (p+). The regions 708 located on either side of conductive via 706 respectively contact electrodes 702L and 702R. Regions 708 contribute to holding the potential of the portion of lightly-doped p-type (p−) layer 312 at the value of the source potential. As a variant, regions 708 are omitted.

An advantage of device 700 lies in the fact that electrodes 702L and 702R ensure a better current distribution. This thus enables to limit or to avoid a heating of device 700 in the conducting state.

FIGS. 8 to 15 hereafter illustrate successive steps of an example of an implementation mode of a method of forming the device 300 of FIG. 3.

Figure 8:
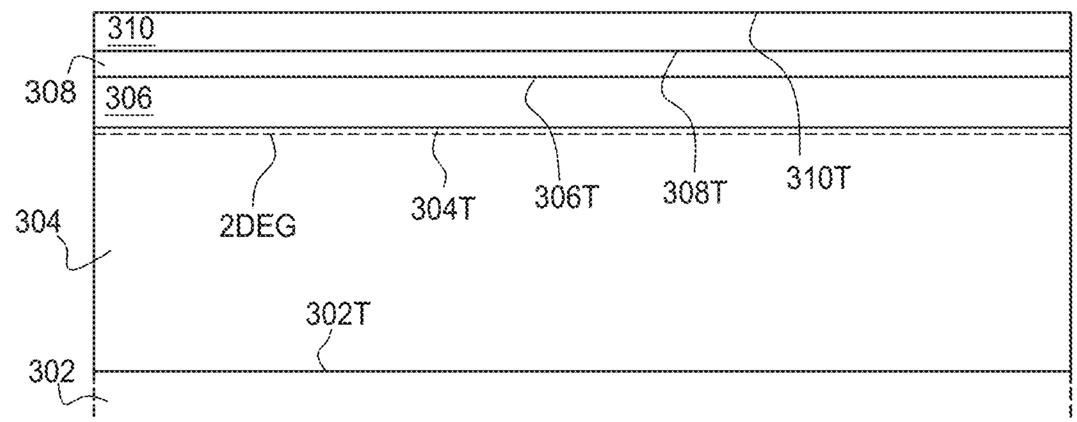
FIG. 8 is a partial simplified cross-section view illustrating a step of an implementation mode of a method of forming the electronic device of FIG. 3.

FIG. 8 is a partial simplified cross-section view illustrating a step of the implementation mode of the method of forming the device 300 of FIG. 3.

During this step, layers 304, 306, 308, and 310 are successively formed, in this order, on the side of surface 302T of substrate 302. More precisely:

- layer 304 continuously extends over the entire upper surface 302T of substrate 302;
- layer 306 continuously extends over the entire upper surface 304T of layer 304;
- layer 308 continuously extends over the entire upper surface 306T of layer 306; and
- layer 310 continuously extends over the entire upper surface 308T of layer 308.

Layers 304, 306, 308, and 310 are for example formed by epitaxy. Although this is not shown in FIG. 8, an intermediate aluminum nitride (AlN) layer may be interposed between layers 304 and 306. In this case, this enables to favor the epitaxy of aluminum-gallium nitride layer 306 on gallium nitride layer 304 by mesh parameter matching.

In FIG. 8, the two-dimensional electron gas 2DEG extends laterally and continuously in layer 304, under the upper surface 304T of layer 304.

Figure 9:
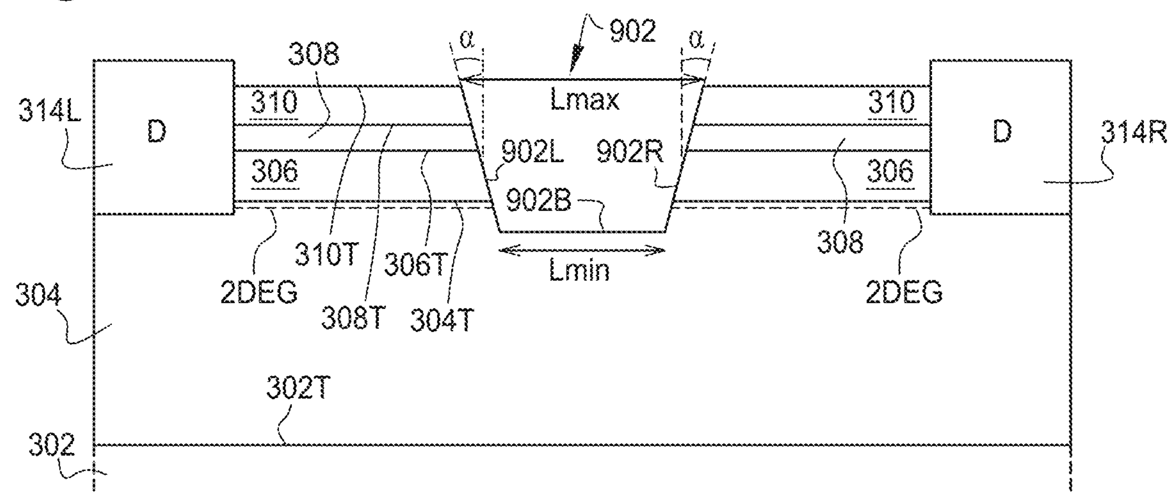
FIG. 9 is a partial simplified cross-section view illustrating a subsequent step of the implementation mode of the method of forming the electronic device of FIG. 3.

FIG. 9 is a partial simplified cross-section view illustrating a subsequent step of the implementation mode of the method of forming the device 300 of FIG. 3.

During this step, a trench 902 vertically extending towards substrate 302 from the upper surface 310T of layer 310 is formed. More precisely, in the shown example, trench 902 crosses layers 310, 308, and 306 and partially penetrates into the thickness of layer 304. Trench 902 stops in layer 304 and does not reach the upper surface 302T of substrate 302.

As an example, trench 902 is formed by atomic layer etching (ALE).

Trench 902 has lateral walls 902L and 902R and a bottom 902B which respectively correspond to the sides 312L and 312R and to the bottom 312B of the future semiconductor region 312 of device 300.

In the shown example, the lateral walls 902L and 902R of trench 902 are oblique. More precisely, trench 902 is for example etched so that its lateral walls 902L and 902R each form an angle $\alpha$ relative to a normal to the upper surface 310T of layer 310. As an example, the angle α formed by walls 902L and 902R is in the range from 5° to 45°, for example, equal to approximately 10°. Trench 902 thus has a flared profile comprising an opening (at the top, in the orientation of FIG. 9) wider than its bottom 902B (at the bottom, in the orientation of FIG. 9). The inclination of the lateral walls 902L and 902R of trench 902 results for example from an isotropic chemical etch step. As a variant, trench 902 may have substantially vertical lateral walls 902L and 902R, that is, having their angle α equal to approximately 0°.

As an example, trench 902 has:

- a maximum width Lmax in the range from 0.4 to 1 μm, for example, equal to approximately 0.5 μm; and
- a minimum width Lmin in the range from 0.2 to 0.4 μm, for example equal to approximately 0.3 μm.

As a variant, the lateral walls 902L and 902R of trench 902 are substantially vertical, angle α being in this case equal to approximately 0°.

Electrodes 314L and 314R are then formed on either side of trench 902. As an example, electrodes 314L and 314R are obtained by deposition and then local etching of a metal layer (not shown) coating the upper surface of layer 310.

At the end of this step, two-dimensional electron gas 2DEG is discontinuous. More precisely, trench 902 separates two-dimensional electron gas 2DEG into two portions located on either side of trench 902. Layers 306, 308, and 310 are further each separated into two separate layer portions located on either side of trench 902.

Figure 10:
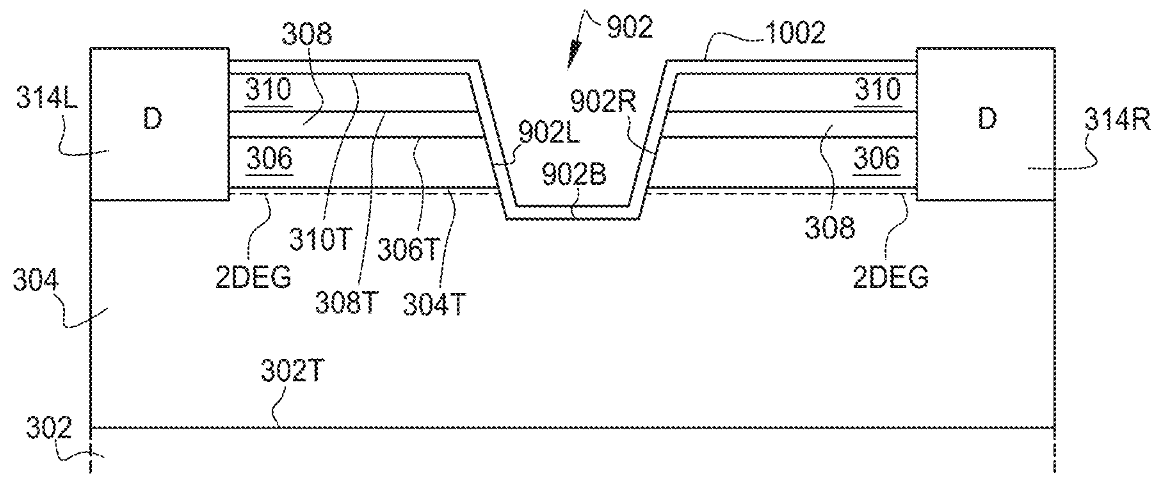
FIG. 10 is a partial simplified cross-section view illustrating still a subsequent step of the implementation mode of the method of forming the electronic device of FIG. 3.

FIG. 10 is a partial simplified cross-section view illustrating still a subsequent step of the implementation mode of the method of forming the device 300 of FIG. 3.

During this step, a conductive layer 1002 is deposited on the structure. Conductive layer 1002 coats the upper surface 310T of the portions of layer 310 as well as the lateral walls 902L, 902R and the bottom 902B of trench 902.

As an example, conductive layer 1002 is formed by a conformal deposition technique, for example, by chemical vapor deposition (CVD). The presence of crystal defects is thus avoided or limited at the interface between layers 304 and 1002, these defects being likely to form trap states for electrons.

Figure 11:
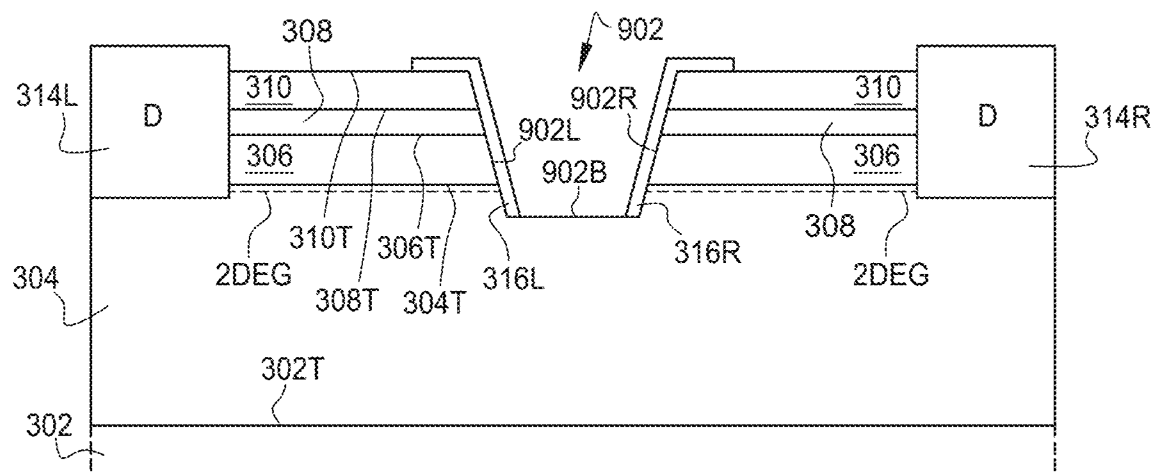
FIG. 11 is a partial simplified cross-section view illustrating still a subsequent step of the implementation mode of the method of forming the electronic device of FIG. 3.

FIG. 11 is a partial simplified cross-section view illustrating still a subsequent step of the implementation mode of the method of forming the device 300 of FIG. 3.

During this step, conductive layer 1002 is etched to expose the bottom 902B of trench 902. A portion of layer 1002 coating the bottom 902B of trench 902 is removed for this purpose. Layer 1002 is thus separated into two separate portions. One more precisely obtains, at the end of the etching, conductive regions 316L and 316R respectively coating the walls 902L and 902R of trench 902. Given that electrodes 314L and 314R are at a same potential, one may alternately provide a one-piece conductive region, that is, continuously coating the sides 902L, 902R and the bottom 902B of trench 902.

In the shown example, layer 1002 is further etched on the side of electrodes 314L and 314R, that is, on the left- and side and on the right-hand side in the orientation of FIG. 11, to expose portions of upper surface 310T of layer 310 located between electrodes 314L, 314R and the future semiconductor region 312.

As an example, conductive regions 316L and 316R are formed by a method of wet etching of layer 1002. This particularly enables to obtain a low roughness at the level of the bottom 902B of trench 902.

The wet etching may be preceded by a dry etch step, for example, plasma-enhanced. In this case, the wet etching enables to improve the surface state, obtained at the end of the dry etch step, of the bottom 902B of trench 902.

Figure 12:
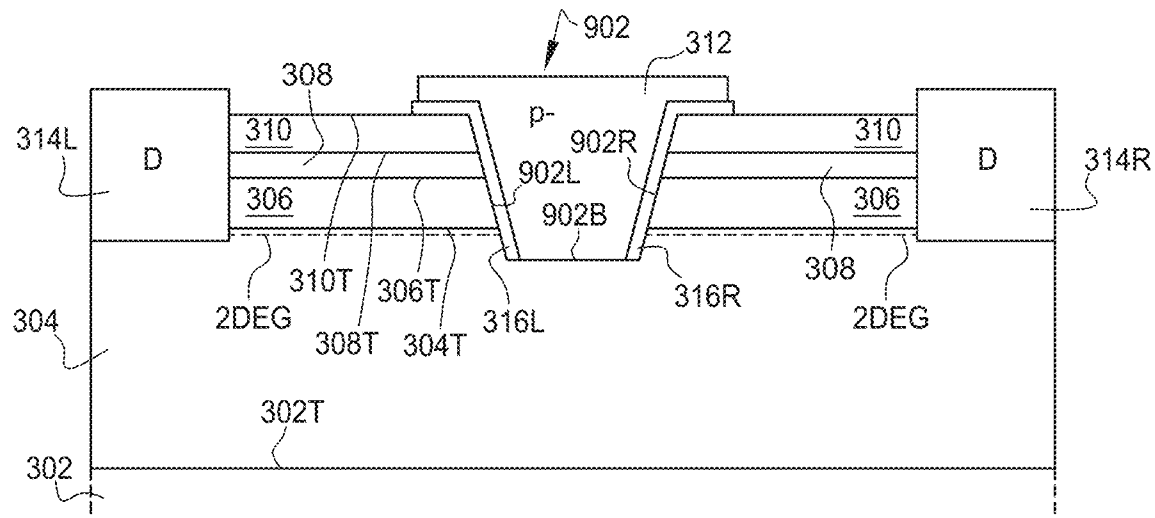
FIG. 12 is a partial simplified cross-section view illustrating still a subsequent step of the implementation mode of the method of forming the electronic device of FIG. 3.

FIG. 12 is a partial simplified cross-section view illustrating still a subsequent step of the implementation mode of the method of forming the device 300 of FIG. 3.

During this step, semiconductor region 312 is formed inside of trench 902. In the shown example, region 312 integrally fills trench 902 and laterally extends on top of and in contact with an upper surface of the portions of conductive regions 316L and 316R located above the portions of layer 310.

Semiconductor region 312 is for example formed by a conformal deposition technique, for example, by chemical vapor deposition (CVD) of lightly-doped p-type (p−) polysilicon.

Figure 13:
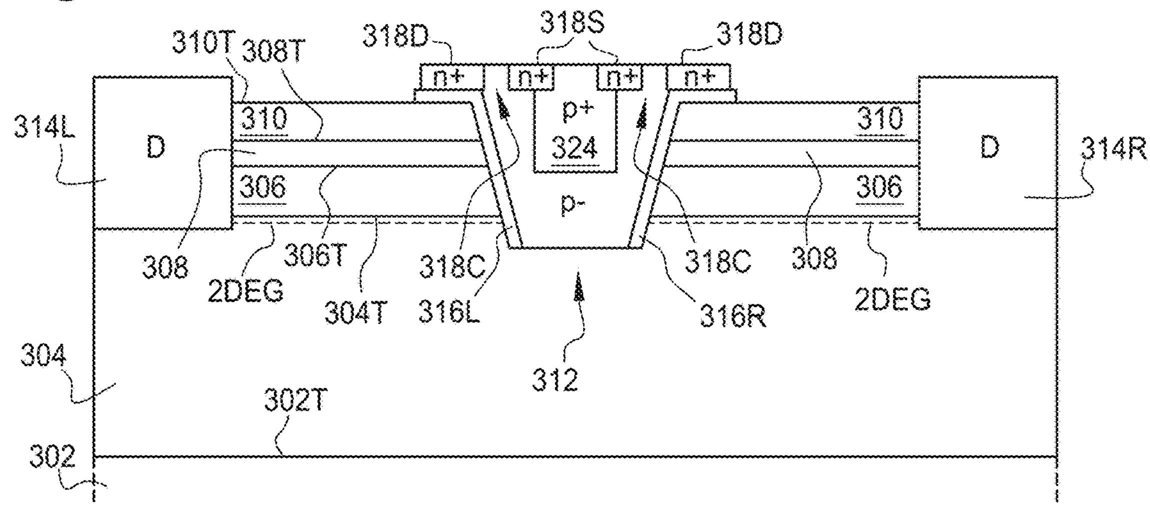
FIG. 13 is a partial simplified cross-section view illustrating still a subsequent step of the implementation mode of the method of forming the electronic device of FIG. 3.

FIG. 13 is a partial simplified cross-section view illustrating still a subsequent step of the implementation mode of the method of forming the device 300 of FIG. 3.

During this step, semiconductor region 312 is doped to form the regions 318D and 318S of the future MOS transistors T1 and T2 and well 324. As an example, the doping of region 312 is performed by ion implantation.

Figure 14:
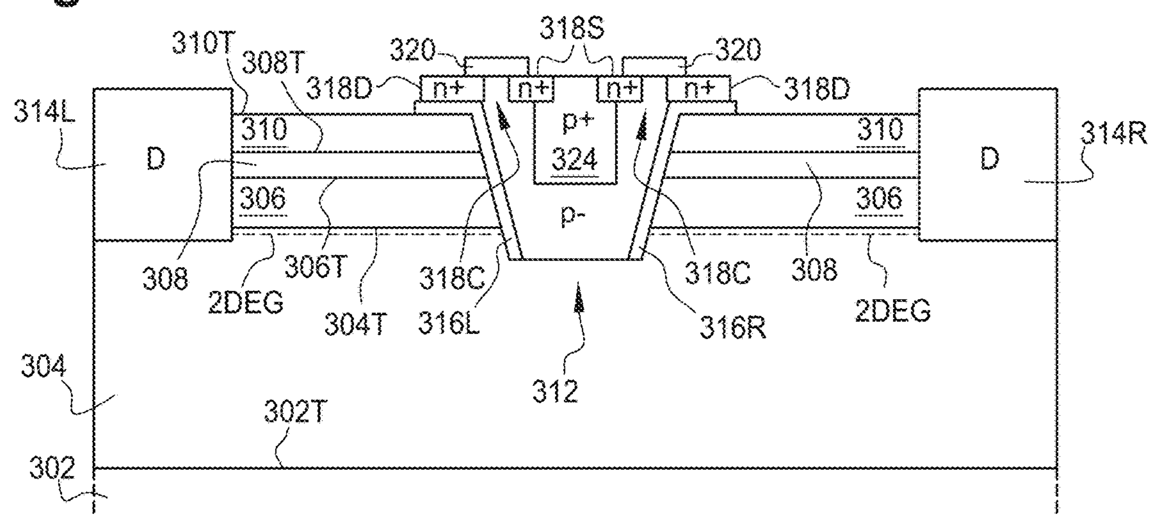
FIG. 14 is a partial simplified cross-section view illustrating still a subsequent step of the implementation mode of the method of forming the electronic device of FIG. 3.

FIG. 14 is a partial simplified cross-section view illustrating still a subsequent step of the implementation mode of the method of forming the device 300 of FIG. 3.

During this step, the gate oxide 320 of each future MOS transistor T1, T2 is formed on top of and in contact with the drain, channel, and source regions 318D, 318C, and 318S of the transistors. As an example, an oxide layer, for example, made of alumina ($Al_2O_3$), having a thickness in the range from 10 to 30 nm is deposited over the structure and then etched to form the gate oxides 320 of the future MOS transistors T1 and T2.

Figure 15:
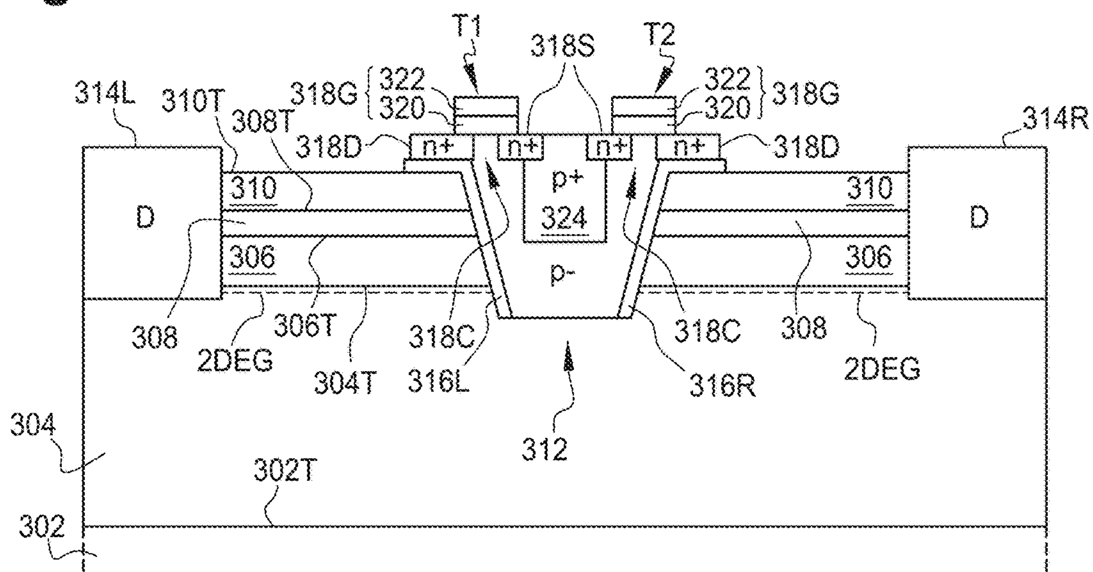
FIG. 15 is a partial simplified cross-section view illustrating still a subsequent step of the implementation mode of the method of forming the electronic device of FIG. 3.

FIG. 15 is a partial simplified cross-section view illustrating still a subsequent step of the implementation mode of the method of forming the device 300 of FIG. 3.

During this step, the gate electrode 322 of each MOS transistor T1, T2 is formed on top of and in contact with the corresponding gate oxide 320. As an example, a conductive layer, for example made of an alloy of titanium nitride (TiN) and of tungsten (W), is deposited over the structure and then etched to form the gate electrodes 322 of MOS transistors T1 and T2.

Starting from the structure described in relation with FIG. 15, electrode 314C is then formed to obtain the device 300 discussed in relation with FIG. 3. As an example, electrode 314C is obtained by deposition and then local etching of a metal layer (not shown) coating the structure. The electrode 314C of device 300 (FIG. 3) is more precisely formed on top of and in contact with an upper surface of well 324 previously formed inside of semiconductor region 312.

Various embodiments, implementation modes, and variants have been described. Those skilled in the art will understand that certain features of these various embodiments, implementation modes, and variants, may be combined and other variants will occur to those skilled in the art.

Based on the above indications, those skilled in the art are in particular capable of providing devices similar to devices 300, 600, and 700 but comprising an insulating layer similar to the layer 504 of device 500 inside of gallium nitride layer 304.

Further, the adaptation of the embodiment of the device 300 described in relation with FIGS. 8 to 15 to obtain the devices 500, 600, and 700 of the respective FIGS. 6, 7, and 8, as well as the devices of the other embodiments and variants mentioned in the present disclosure, is also within the abilities of those skilled in the art.

Finally, the practical implementation of the described embodiments, implementation modes, and variants is within the abilities of those skilled in the art based on the functional indications given hereabove. In particular, those skilled in the art are capable of selecting the materials of conductive regions 316L, 316R, and 704, as well as the doping rates of each of regions 312, 318S, 318D, 708 and of well 324 according to the targeted application.

The invention claimed is:

1. Electronic device comprising:

a semiconductor region located on a gallium nitride layer and partially penetrating into the gallium nitride layer;

two electrodes, located on either side of and not in contact with the semiconductor region, the electrodes partially penetrating into the gallium nitride layer and being connected to the semiconductor region via a two-dimensional electron gas; and two lateral MOS transistors formed inside and on top of the semiconductor region and connected in series between the two electrodes.

2. Device according to claim 1, wherein each transistor is configured to control the flowing of an electric current between one of said electrodes and one or a plurality of second electrodes supported by the semiconductor region.

3. Device according to claim 2, wherein a drain region of each transistor is coupled, via a two-dimensional electrode gas, to one of said electrodes.

4. Device according to claim 3, further comprising one or a plurality of conductive regions contacting the drain regions of the transistors and partially penetrating into the gallium nitride layer.

5. Device according to claim 4, comprising exactly two conductive regions coating opposite sides of the semiconductor region located in front of said electrodes and a single second electrode located between the transistors.

6. Device according to claim 4, comprising exactly two conductive regions comprising conductive vias located on either side of the semiconductor region and a single second electrode located between the transistors.

7. Device according to claim 4, comprising a single conductive region comprising a conductive via crossing the semiconductor region and exactly two second electrodes located on either side of the transistors.

8. Device according to claim 2, wherein the semiconductor region partially penetrates into the gallium nitride layer.

9. Device according to claim 1, wherein each transistor comprises a gate region located vertically in line with a channel region located between source and drain regions formed in the semiconductor region.

10. Device according to claim 9, wherein the source regions of the transistors are doped with a first conductivity type and separated by a well formed in the semiconductor region and doped with a second conductivity type, opposite to the first conductivity type.

11. Device according to claim 1, wherein a lower portion of the semiconductor region is insulated from the gallium nitride layer.

12. Device according to claim 1, wherein the first electrodes are intended to be taken to a same potential.

13. Device according to claim 1, wherein the semiconductor region is made of a material different from that of the gallium nitride layer, preferably of silicon or of silicon carbide.

14. Method of forming a device according to claim 1, the method comprising the steps of:

a) forming a trench inside of the gallium nitride layer;

b) forming the first electrodes on either side of the trench;

c) filling the trench with the semiconductor region;

d) forming the MOS transistors.

15. Method according to claim 14, wherein each transistor is configured to control the flowing of an electric current between one of said electrodes and one or a plurality of second electrodes supported by the semiconductor region, and further comprising, after step d) a step of forming the second electrode.

16. Method according to claim 14, wherein each transistor is configured to control the flowing of an electric current between one of said electrodes and one or a plurality of second electrodes supported by the semiconductor region and wherein the drain region of each transistor is coupled, via a two-dimensional electrode gas, to one of said electrodes, further comprising one or a plurality of conductive regions contacting the drain regions of the transistors and partially penetrating into the gallium nitride layer, wherein the conductive regions are formed at step b).

* * * * *